US011456201B2

(12) United States Patent
Takada

(10) Patent No.: US 11,456,201 B2
(45) Date of Patent: Sep. 27, 2022

(54) SEMICONDUCTOR SUBSTRATE AND METHOD OF MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Yoshiharu Takada, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 77 days.

(21) Appl. No.: 17/194,506

(22) Filed: Mar. 8, 2021

(65) Prior Publication Data
US 2022/0093442 A1    Mar. 24, 2022

(30) Foreign Application Priority Data

Sep. 23, 2020   (JP) .............................. JP2020-158214

(51) Int. Cl.
*H01L 21/683*   (2006.01)
*H01L 21/288*   (2006.01)
(Continued)

(52) U.S. Cl.
CPC ........ *H01L 21/6836* (2013.01); *H01L 21/288* (2013.01); *H01L 21/304* (2013.01);
(Continued)

(58) Field of Classification Search
CPC ... H01L 21/288; H01L 21/6836; H01L 23/13; H01L 23/142; H01L 23/498; H01L 23/49894
See application file for complete search history.

(56) References Cited

U.S. PATENT DOCUMENTS

| 4,928,513 A | * | 5/1990 | Sugihara | ................ G01N 27/12 73/31.06 |
| 2003/0215985 A1 | * | 11/2003 | Kouno | .................... H01L 21/78 257/E29.198 |

(Continued)

FOREIGN PATENT DOCUMENTS

| CN | 107533963 | * | 1/2018 |
| CN | 107680936 | * | 2/2018 |

(Continued)

*Primary Examiner* — Ahmed N Sefer
(74) *Attorney, Agent, or Firm* — Allen & Overy LLP

(57) ABSTRACT

A semiconductor substrate according to an embodiment includes a substrate having a first substrate surface, the substrate having a first outer diameter; a metal layer provided on the first substrate surface, the metal layer having a second outer diameter smaller than the first outer diameter; a first adhesive tape having a ring shape, the ring shape having a third outer diameter smaller than the first outer diameter and larger than the second outer diameter, the ring shape having a third inner diameter smaller than the second outer diameter, the first adhesive tape having a first base material, the first base material having a first surface and a second surface opposed to the first surface, the first adhesive tape having a first adhesive layer provided on the first surface, the first adhesive tape being attached to the first substrate surface and the metal layer through the first adhesive layer; and a second adhesive tape having a fourth outer diameter smaller than the first outer diameter and larger than the third inner diameter, the second adhesive tape having a second base material having a third surface and a fourth surface opposed to the third surface, the second adhesive tape having a second adhesive layer provided on the third surface, the second adhesive tape being attached to the second surface and the metal layer through the second adhesive layer.

6 Claims, 10 Drawing Sheets

(51) Int. Cl.
*H01L 21/304* (2006.01)
*H01L 23/498* (2006.01)
*H01L 23/13* (2006.01)
*H01L 23/14* (2006.01)

(52) U.S. Cl.
CPC ........ *H01L 23/13* (2013.01); *H01L 23/49894* (2013.01); *H01L 23/142* (2013.01); *H01L 23/498* (2013.01)

(56) References Cited

U.S. PATENT DOCUMENTS

| | | | | |
|---|---|---|---|---|
| 2014/0070374 | A1* | 3/2014 | Numaguchi | ........ H01L 21/0274 438/465 |
| 2015/0001688 | A1* | 1/2015 | Iguchi | ................. H01L 29/0657 257/622 |
| 2015/0108612 | A1* | 4/2015 | Numaguchi | ...... H01L 21/32139 257/620 |

FOREIGN PATENT DOCUMENTS

| | | | |
|---|---|---|---|
| JP | 3187573 | U | 12/2013 |
| JP | 5471064 | B2 | 4/2014 |
| JP | 2014065952 | * | 4/2014 |
| JP | 2015-162634 | A | 9/2015 |
| JP | 2017-179605 | A | 10/2017 |

\* cited by examiner

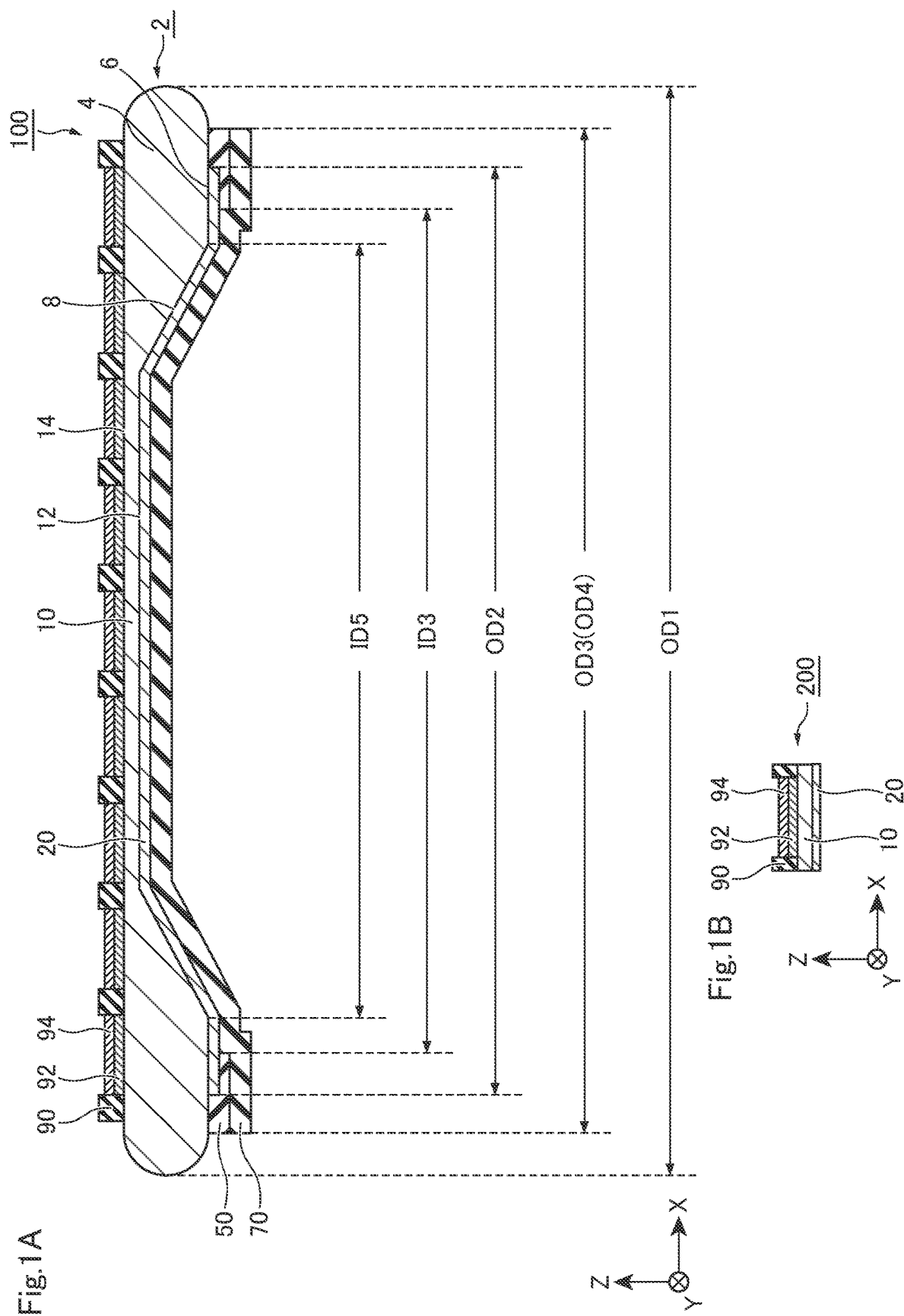

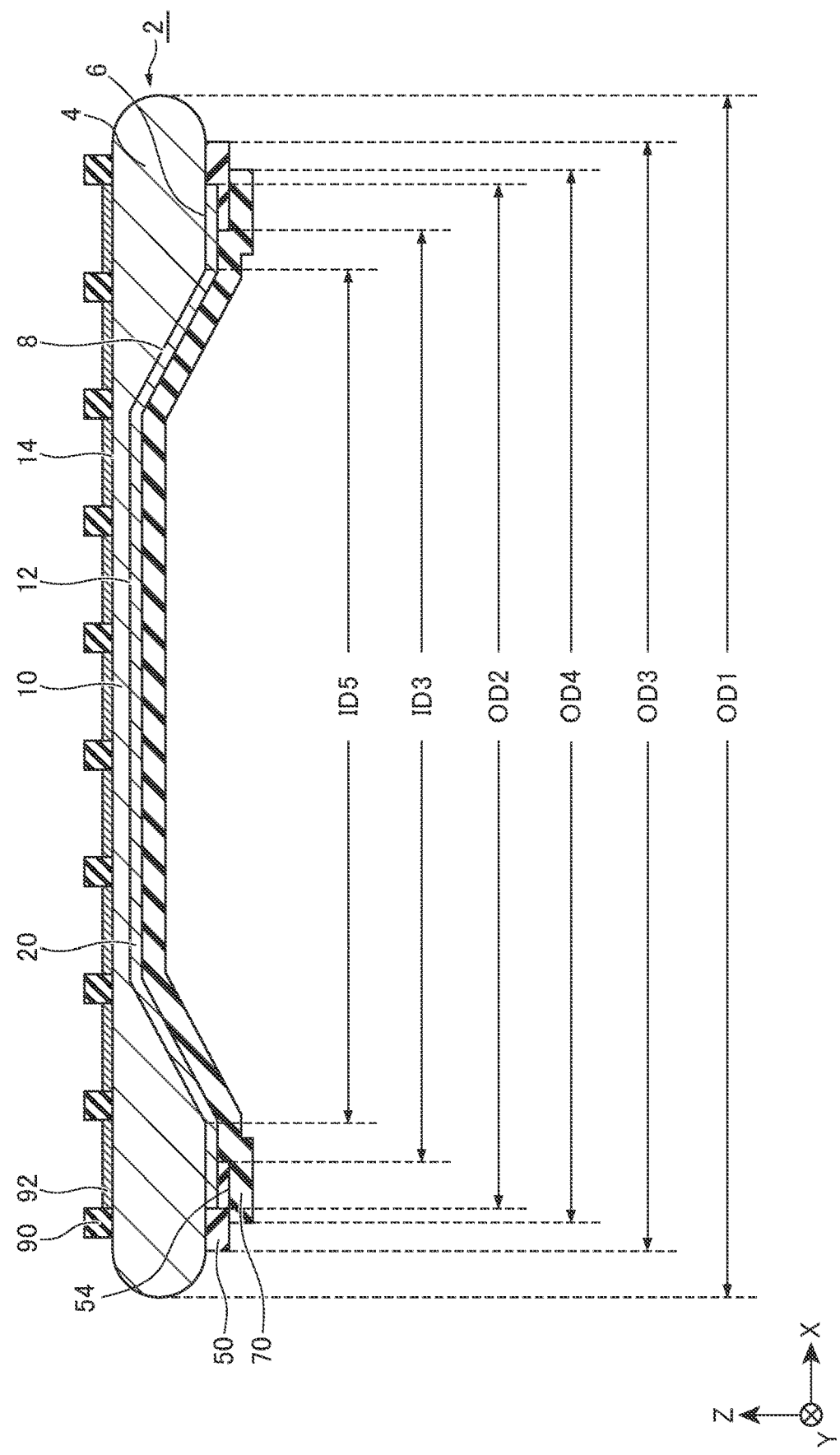

SEMICONDUCTOR SUBSTRATE AND METHOD OF MANUFACTURING SEMICONDUCTOR DEVICE

CROSS-REFERENCE TO RELATED APPLICATION

This application is based upon and claims the benefit of priority from Japanese Patent Application No. 2020-158214, filed on Sep. 23, 2020, the entire contents of which are incorporated herein by reference.

FIELD

Embodiments described herein relate generally to a semiconductor substrate and a method for manufacturing a semiconductor device.

BACKGROUND

Semiconductor devices, such as a MOSFET (Metal Oxide Semiconductor Field Effect Transistor), are used for power conversion, for example.

In the manufacture of semiconductor substrates used in such semiconductor devices, a plating process is used to form electrodes. In this plating process, a protective adhesive tape is attached to the part where a plating solution is not desired to be supplied.

BRIEF DESCRIPTION OF THE DRAWINGS

FIGS. 1A and 1B are schematic cross sectional views of a semiconductor substrate and a semiconductor device according to an embodiment;

FIG. 10 is a schematic cross sectional view showing the manufacturing process steps of the third manufacturing method for the semiconductor device according to an embodiment.

DETAILED DESCRIPTION

Figure 2A:
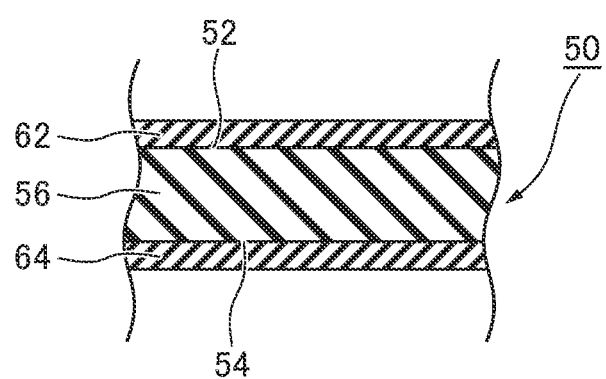
FIGS. 2A and 2B are schematic cross sectional views of a first adhesive tape according to an embodiment.

In the following, embodiments of the present disclosure will be described with reference to the drawings. It should be noted that in the following description, the same members and any other components are designated with the same reference signs, and the description of the members and any other components, which are once described, is appropriately omitted.

In the present specification, in order to show the positional relationship between components and the like, the upward direction in the drawings is described as "upper", and the downward direction in the drawings is described as "lower". In the present specification, the concepts of "upper" and "lower" are not necessarily the terms expressing the relationship between the orientations of gravity.

Embodiment

A semiconductor substrate according to an embodiment includes a substrate having a first substrate surface, the substrate having a first outer diameter; a metal layer provided on the first substrate surface, the metal layer having a second outer diameter smaller than the first outer diameter; a first adhesive tape having a ring shape, the ring shape having a third outer diameter smaller than the first outer diameter and larger than the second outer diameter, the ring shape having a third inner diameter smaller than the second outer diameter, the first adhesive tape having a first base material, the first base material having a first surface and a second surface opposed to the first surface, the first adhesive tape having a first adhesive layer provided on the first surface, the first adhesive tape being attached to the first substrate surface and the metal layer through the first adhesive layer; and a second adhesive tape having a fourth outer diameter smaller than the first outer diameter and larger than the third inner diameter, the second adhesive tape having a second base material having a third surface and a fourth surface opposed to the third surface, the second adhesive tape having a second adhesive layer provided on the third surface, the second adhesive tape being attached to the second surface and the metal layer through the second adhesive layer.

FIGS. 1A and 1B are schematic cross sectional views of a semiconductor substrate 100 and a semiconductor device 200 according to an embodiment. FIG. 1A is a schematic cross sectional view of the semiconductor substrate 100 according to the embodiment. FIG. 1B is a schematic cross sectional view of the semiconductor device 200 according to the embodiment.

Figure 2B:
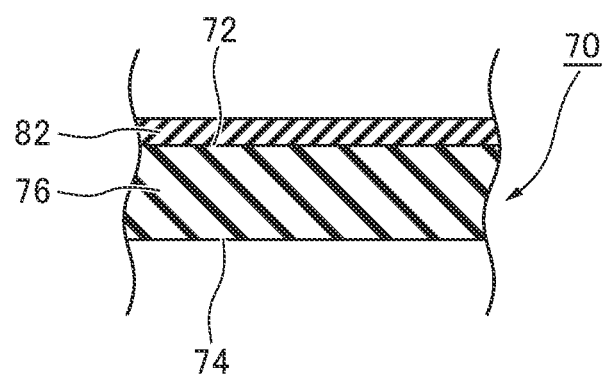

FIGS. 2A and 2B are schematic cross sectional views of a first adhesive tape 50 and a second adhesive tape 70 according to the embodiment.

The semiconductor substrate 100 and the semiconductor device 200 of the embodiment will be described with reference to FIGS. 1A and 1B and FIGS. 2A and 2B.

The semiconductor substrate 100 includes a substrate 2, a metal layer 20, the first adhesive tape 50, the second adhesive tape 70, an insulating film 90, an electrode 92, and a plating layer 94. The semiconductor substrate 100 according to the embodiment is a semiconductor wafer formed with a MOSFET, for example.

The substrate 2 includes a semiconductor material. Here, examples of semiconductor materials include Si (silicon), SiC (silicon carbide), GaAs (gallium arsenide), or GaN (gallium nitride). However, the semiconductor materials are not limited to these. The outer diameter of the substrate 2 is the first outer diameter $OD_1$.

The substrate 2 is formed with a recess 10 by grinding a part of the substrate 2 to be thinned, for example. The bottom surface of the recess 10 is a first substrate surface (an example of the substrate surface) 12. On the opposite side of the first substrate surface 12, a second substrate surface 14 opposed to the first substrate surface 12 is provided. With forming the recess 10, a ring projection 4 (ring-shaped projection 4) is formed around the recess 10. The ring projection 4 has a top 6 and an inner surface 8. The inner surface 8 connects the top 6 to the first substrate surface 12. The inner diameter of the top 6 is $ID_5$. It should be noted that an angle formed by the first substrate surface 12 and the inner surface 8 is not limited to the angle shown in FIGS. 1A and 1B. The ring projection 4 does not necessarily have to be provided.

On the second substrate surface 14, a MOSFET (an example of a transistor) is provided. The electrode 92 is provided on the second substrate surface 14. The electrode 92 corresponds to the source electrode or the gate electrode of the MOSFET, for example. The electrode 92 includes Al (aluminum), for example. The plating layer 94 is provided on the surface of the electrode 92. The plating layer 94 includes an alloy of Ni (nickel) and Au (gold), for example. The plating layer 94 is provided for increasing the bonding strength of a binder, not shown, such as solder to the electrode 92. The plating layer 94 is formed by the immersion of the substrate 2 in a predetermined plating solution, not shown, by electroless plating. A pair of the electrode 92 and the plating layer 94 is separated from each other by the insulating film 90 including polyimide, for example. It should be noted that, the forms of the electrode 92, the plating layer 94, and the insulating film 90 are not limited to the forms shown in FIGS. 1A and 1B.

Here, an X-direction, a Y-direction vertically intersecting with the X-direction, and a Z-direction vertically intersecting with the X-direction and in the Y-direction are defined. The first substrate surface 12 and the second substrate surface 14 are to be provided in parallel with the X-Y face.

The metal layer 20 is provided on the first substrate surface 12, on the inner surface 8, and on a part of the top 6 of the ring projection 4. The second outer diameter $OD_2$ of the metal layer 20 is smaller than the first outer diameter $OD_1$ of the substrate 2. The metal layer 20 includes Cu (copper), Al, or any other element, for example, and the metal layer 20 is formed by high vacuum sputtering, and any other method. The metal layer 20 corresponds to the drain electrode (an example of the electrode) of the MOSFET.

The first, adhesive tape 50 has a first base material 56 having a first surface 52 and a second surface 54 opposed to the first surface 52, a first adhesive layer 62 provided on the first surface 52, and a third adhesive layer 64 provided on the second surface 54. The shape of the first adhesive tape 50 is a ring shape (a ring-like shape), and the first adhesive tape 50 has a third outer diameter $OD_3$ smaller than the first outer diameter $OD_1$ and larger than the second outer diameter $OD_2$ and a third inner diameter $ID_3$ smaller than the second outer diameter $OD_2$ and larger than the fifth inner diameter $ID_5$. The first surface 52 of the first adhesive tape 50 is attached on the top 6 and the metal layer 20 provided on the top 6 through the first adhesive layer 62. It should be noted that the third adhesive layer 64 does not necessarily have to be provided.

The second adhesive tape 70 has a second base material 76 having a third surface 72 and a fourth surface 74 opposed to the third surface 72 and a second adhesive layer 82 provided on the third surface 72. The second adhesive tape 70 has a fourth outer diameter $OD_4$ smaller than the first outer diameter $OD_1$ and larger than the third inner diameter $ID_3$. The second adhesive layer 82 is attached to the third adhesive layer 64. The third surface 72 of the second adhesive tape 70 is attached to the second surface 54 of the first adhesive tape 50 through the second adhesive layer 82 and the third adhesive layer 64. The third surface 72 of the second adhesive tape 70 is attached to the metal layer 20 provided on the part of the top 6, the metal layer 20 provided on the inner surface 8, and the metal layer 20 provided on the first substrate surface 12.

The first adhesive tape 50 and the second adhesive tape 70 are for protecting the predetermined plating solution from contacting the metal layer 20 when the substrate 2 is immersed in the predetermined plating solution for forming the plating layer 94.

It should be noted that in FIGS. 1A and 1B and FIGS. 3 to 10, the first base material 56, the first adhesive layer 62, and the third adhesive layer 64 are collectively shown as the first adhesive tape 50. In FIGS. 1A and 1B and FIGS. 3 to 10, the second base material 76 and the second adhesive layer 82 are collectively shown as the second adhesive tape 70.

In FIGS. 1A and 1B, the fourth outer diameter $OD_4$ is shown as equal to the third outer diameter $OD_3$. However, the fourth outer diameter $OD_4$ does not necessarily have to be equal to the third outer diameter $OD_3$. Preferably, the fourth outer diameter $OD_4$ is equal to the third outer diameter $OD_3$ or less.

The semiconductor substrate 100 shown in FIG. 1A is diced, and thus the semiconductor device 200, as shown in FIG. 1B, is obtained, in which a part of the semiconductor substrate 100 is formed in a chip.

Next, a method of manufacturing the semiconductor device 200 according to the embodiment will be described.

A first manufacturing method for the semiconductor device according to the embodiment includes preparing a substrate having a substrate surface the substrate having a first outer diameter, the substrate having a metal layer on the substrate surface, the metal layer having a second outer diameter smaller than the first outer diameter; attaching a first adhesive tape to the substrate and the metal layer through a first adhesive layer, the first adhesive tape having a first base material, the first base material having a third outer diameter larger than the second outer diameter, the first base material having a first surface and a second surface opposed to the first surface, the first adhesive tape having the first adhesive layer provided on the first surface; forming a hole on the first adhesive tape such that a part of the metal layer is exposed, the hole having a third inner diameter smaller than the second outer diameter; and attaching a second adhesive tape on the second surface and the metal layer through a second adhesive layer, the second adhesive tape having a second base material, the second base material having a fourth outer diameter larger than the third inner diameter, the second base material having a third surface and a fourth surface opposed to the third surface, the second adhesive tape having the second adhesive layer provided on the third surface.

First, the substrate 2 is prepared. The substrate 2 has the ring projection 4 provided on the outer peripheral part of the first substrate surface 12, for example, the ring projection 4 having the top 6 and the inner surface 8 connecting the top 6 to the first substrate surface 12, the ring projection 4 having the inner diameter of the top being the fifth inner diameter IDs. The substrate 2 has the first outer diameter $OD_1$. The metal layer 20 having the second outer diameter $OD_2$ smaller than the first outer diameter $OD_1$ is provided on the first substrate surface 12, on the inner surface 8, and on the part of the top 6. The second substrate surface 14 is formed with the insulating film 90 and the electrode 92.

Figure 3:
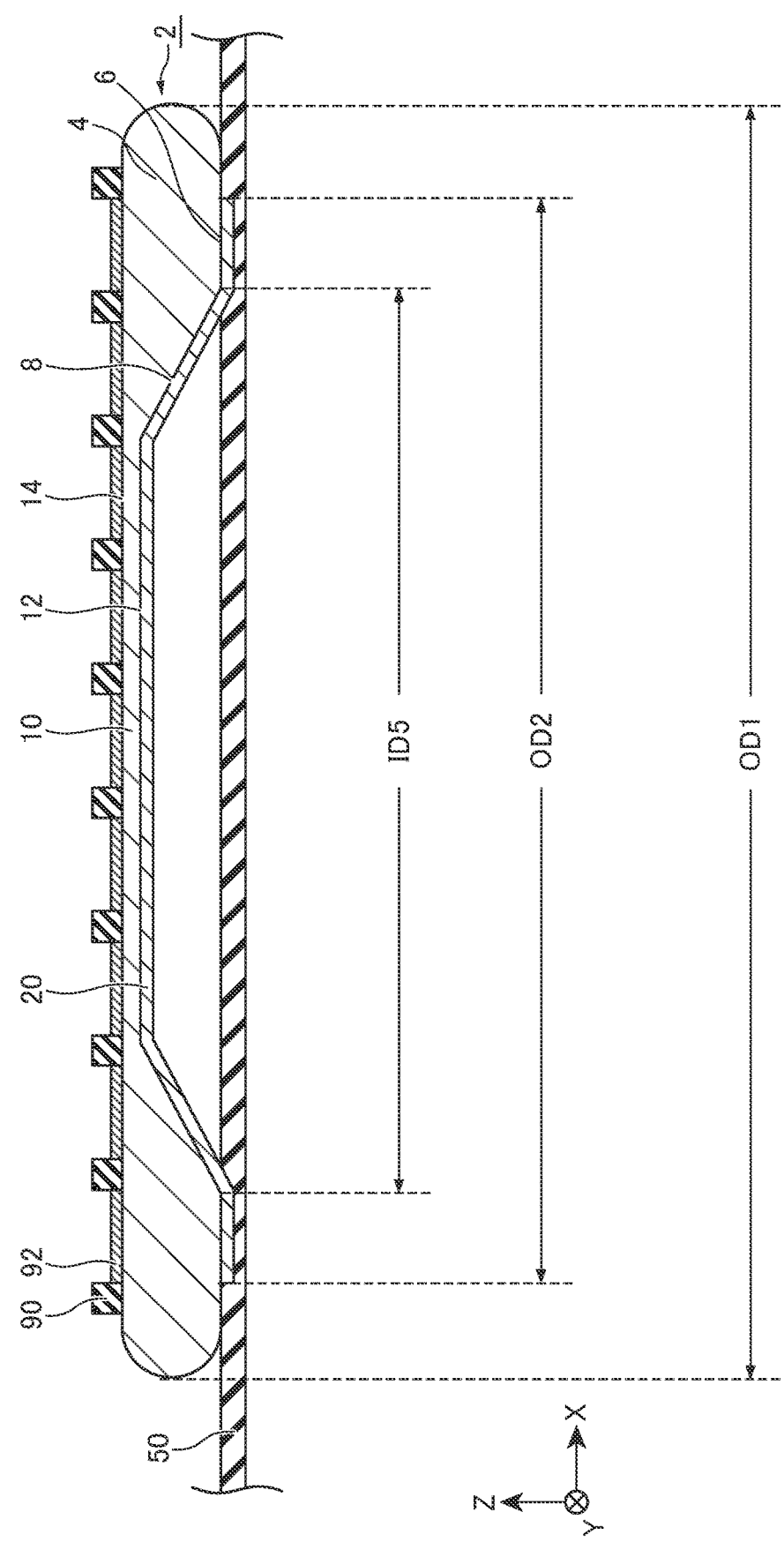
FIG. 3 is a schematic cross sectional view showing the manufacturing process steps of a first manufacturing method for the semiconductor device according to an embodiment.

Subsequently, the first adhesive layer 62 of the first adhesive tape 50 having the third outer diameter $OD_3$ larger than the first outer diameter $OD_1$ is attached to the top 6 and the metal layer 20 provided on the part of the top 6. Here, the first adhesive tape 50 is in a wound roll state, for example. The first adhesive tape 50 in the wound roll state is attached. The first adhesive tape 50 is a tape a part of which is cut from the wound roll state, for example, the first adhesive tape 50 is cut such that the outer diameter of the first adhesive tape 50 is larger than the first outer diameter $OD_1$ (FIG. 3). It should be noted that although the outer diameter of the first adhesive tape 50 is the third outer diameter $OD_3$, the third outer diameter $OD_3$ is not shown because the first adhesive tape 50 lies off FIG. 3.

Figure 4:
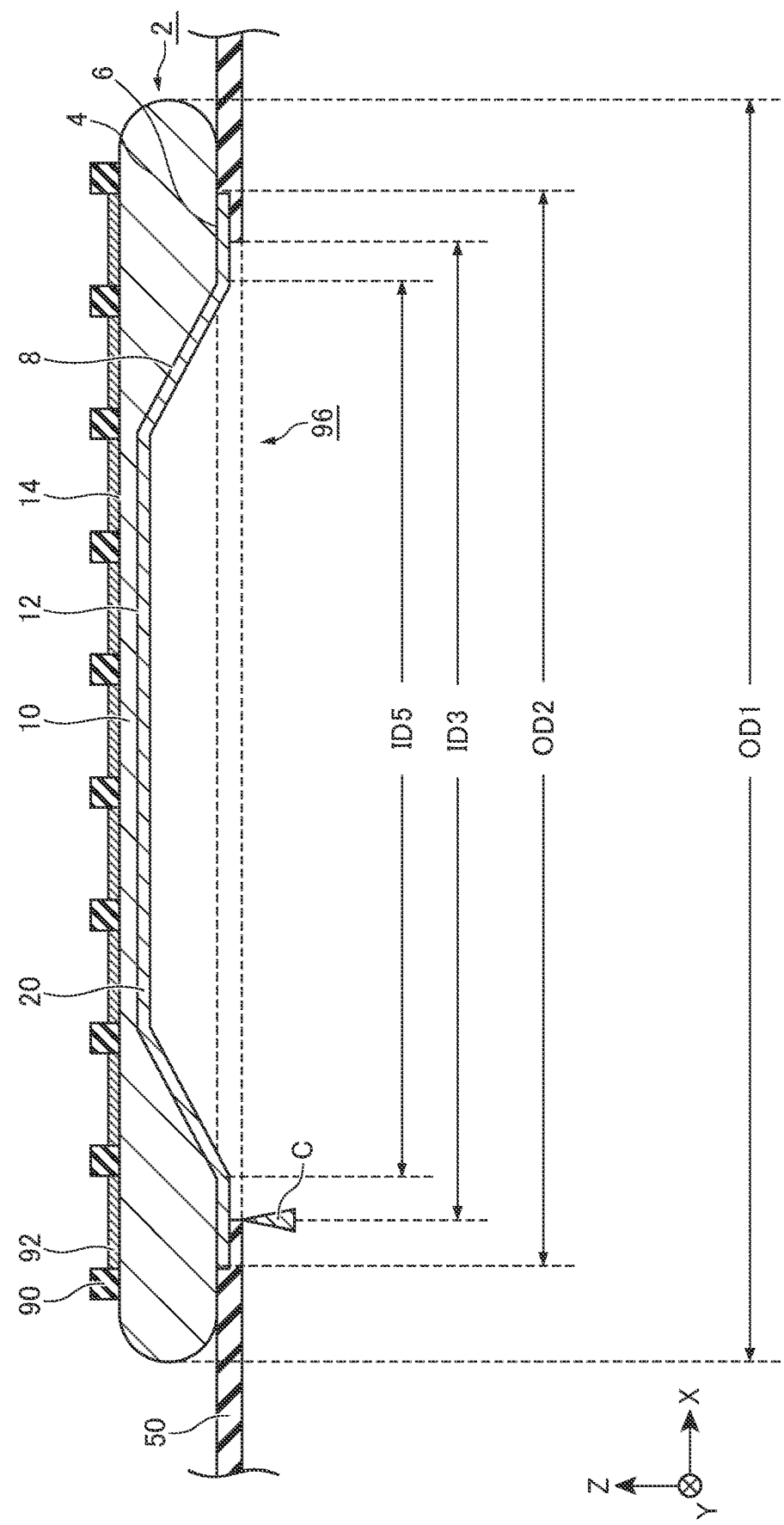
FIG. 4 is a schematic cross sectional view showing the manufacturing process steps of the first manufacturing method for the semiconductor device according to an embodiment.

Subsequently, on the first adhesive tape 50, a hole 96 having the third inner diameter $ID_3$ smaller than the second outer diameter $OD_2$ is formed such that a part of the metal layer 20 in the top 6, the metal layer 20 in the inner surface 8, and the metal layer 20 on the first substrate surface 12 are exposed. For forming the hole 96, a known tape cutter C, for example is used (FIG. 4).

Figure 5:
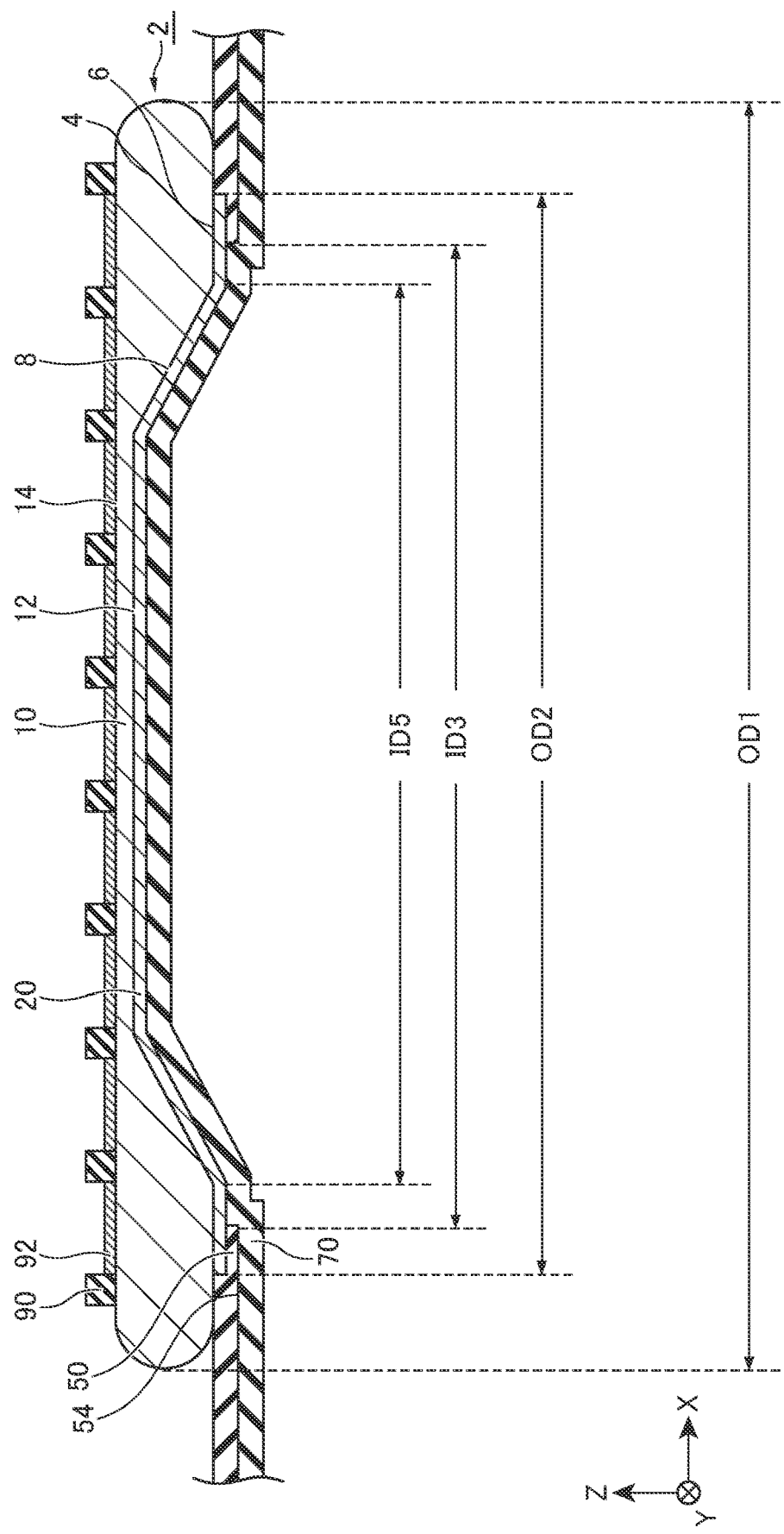
FIG. 5 is a schematic cross sectional view showing the manufacturing process steps of the first manufacturing method for the semiconductor device according to an embodiment.

Subsequently, the second adhesive layer 82 of the second adhesive tape 70 having the fourth outer diameter $OD_4$ larger than the first outer diameter $OD_1$ is attached on the second surface 54, on the part of the metal layer 20 in the top 6, the metal layer 20 in the inner surface 8, and the metal layer 20 on the first substrate surface 12. It should be noted that the second adhesive tape 70 is in a wound roll state, for example. The second adhesive tape 70 in the wound roll state is attached. The attached second adhesive tape 70 is a tape part which is cut from the wound roll state, and the second adhesive tape 70 is cut such that the outer diameter (the fourth outer diameter $OD_4$) is larger than the first outer diameter $OD_1$. The second adhesive layer 82 is attached in a vacuum, for example, and thus such attachment can be performed excellently (FIG. 5). It should be noted that although the outer diameter of the second adhesive tape 70 is the fourth outer diameter $OD_4$, the fourth outer diameter $OD_4$ is not shown because the second adhesive tape 70 lies off FIG. 5.

Figure 6:
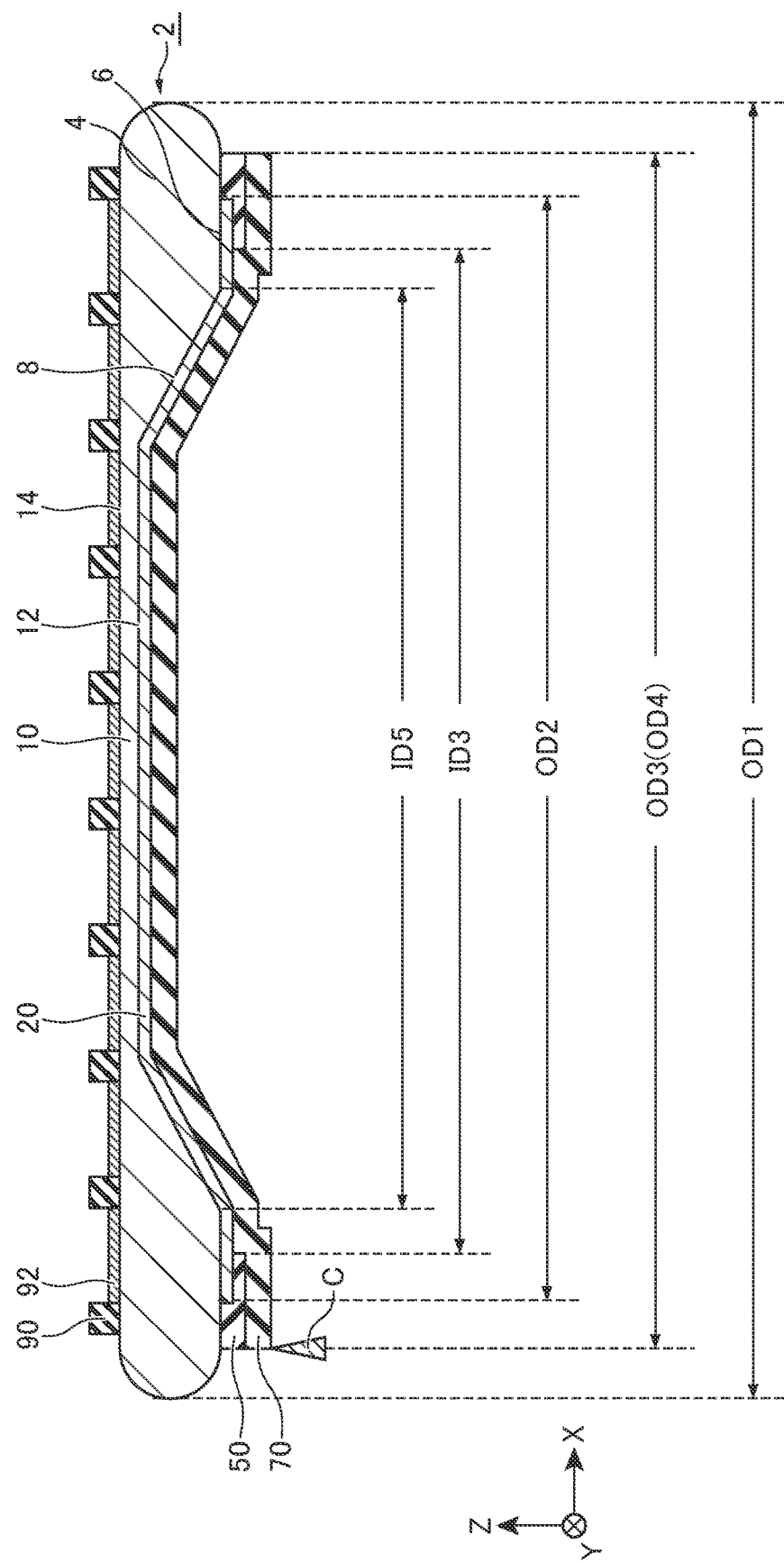
FIG. 6 is a schematic cross sectional view showing the manufacturing process steps of the first manufacturing method for the semiconductor device according to the embodiment.

Subsequently, the first adhesive tape 50 is cut such that the third outer diameter $OD_3$ is smaller than the first outer diameter $OD_1$ and larger than the second outer diameter $OD_2$. Here, for example, the first adhesive tape 50 and the second adhesive tape 70 are cut such that the third outer diameter $OD_3$ is equal to the fourth outer diameter $OD_4$ (FIG. 6).

Subsequently, the semiconductor device in the process of manufacture is immersed in a predetermined plating solution, not shown, for example, and the plating layer 94 is formed on the electrode 92 by electroless plating. Thus, the semiconductor substrate 100 according to the embodiment is obtained. The semiconductor substrate 100 is diced, and the semiconductor device 200 according to the embodiment, is obtained.

Next, a second manufacturing method for the semiconductor device according to the embodiment will be described. First, the process steps of the method are the same as the first manufacturing method up to the step shown in FIG. 4, in which the hole 96 having the third inner diameter $ID_3$ smaller than the second outer diameter $OD_2$ and larger than the fifth inner diameter $ID_5$ is formed on the first adhesive tape 50 such that a part of the metal layer 20 in the top 6, the metal layer 20 in the inner surface 8, and the metal layer 20 on the first substrate surface 12 are exposed.

Figure 7:
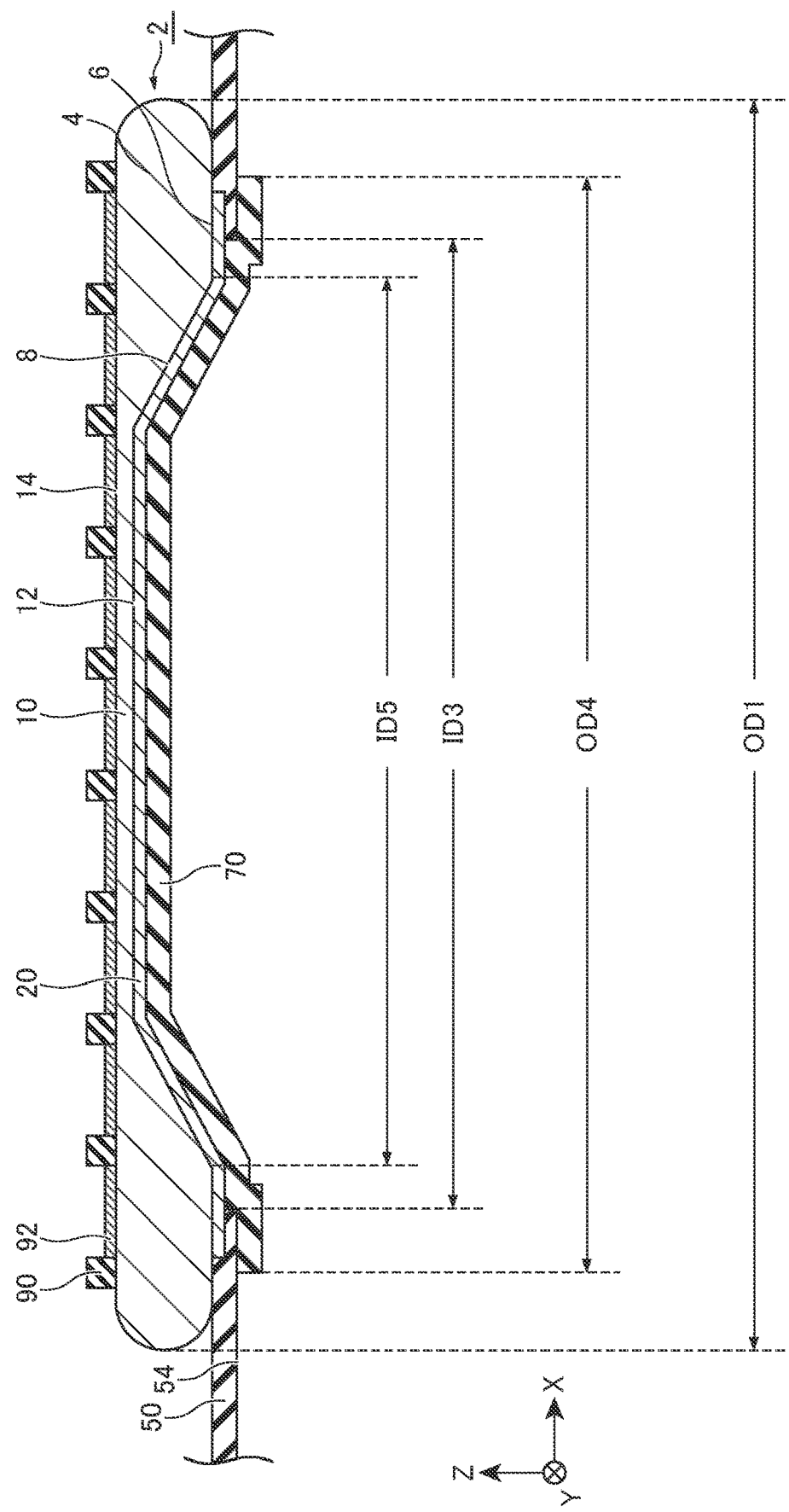
FIG. 7 is a schematic cross sectional view showing the manufacturing process steps of a second manufacturing method for the semiconductor device according to an embodiment.

Subsequently, the second adhesive layer 82 of the second adhesive tape 70 having the fourth outer diameter $OD_4$ smaller than the first outer diameter $OD_1$ and larger than the third inner diameter $ID_3$ is attached on the second surface 54 and the metal layer 20. In other words, in the second manufacturing method, the second adhesive tape 70 is cut in advance to have the fourth outer diameter $OD_4$, and then the third surface 72 of the second adhesive tape 70 is attached on the second surface 54 and the metal layer 20 (FIG. 7).

Figure 8:
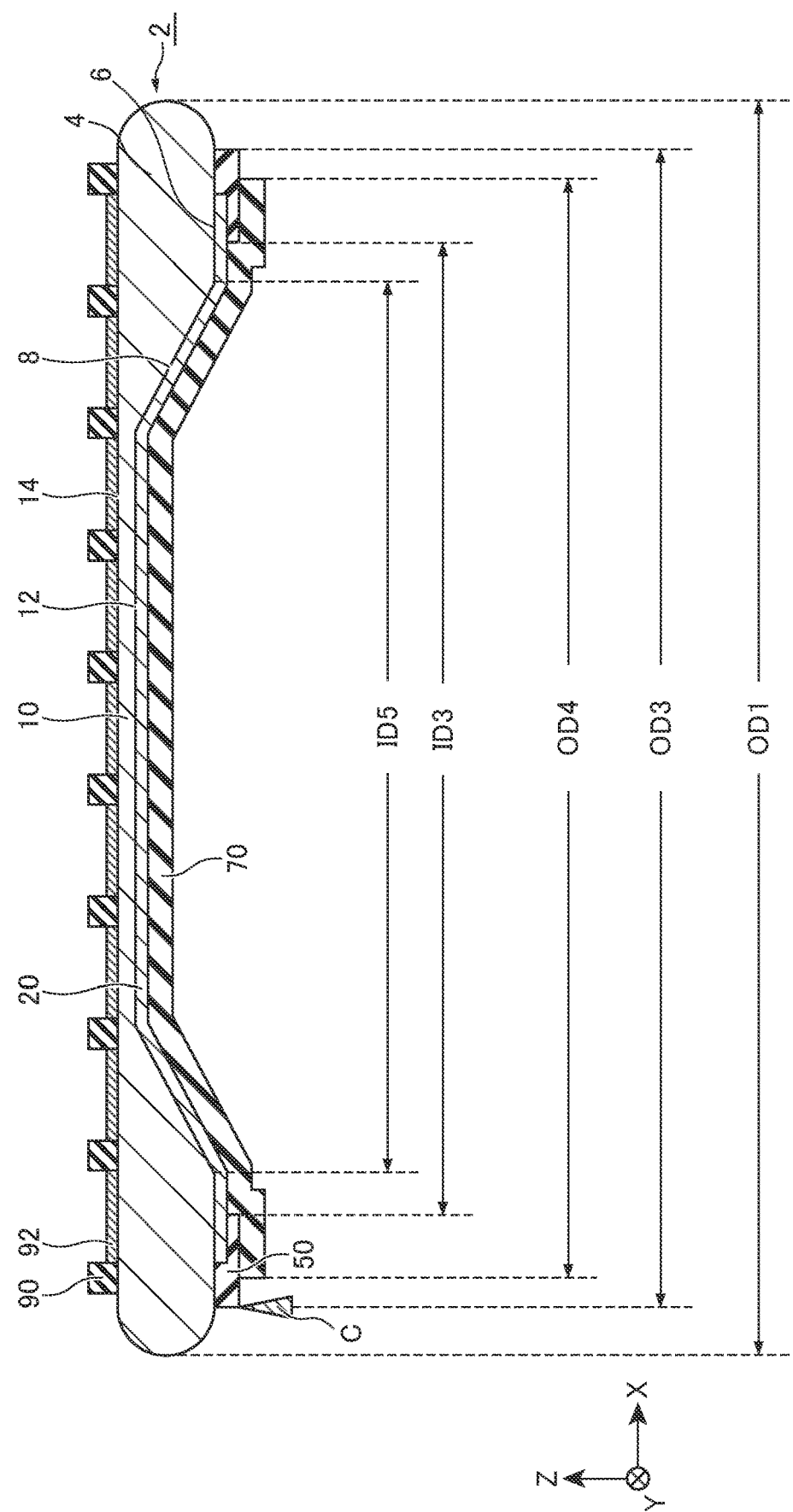
FIG. 8 is a schematic cross sectional view showing the manufacturing process steps of the second manufacturing method for the semiconductor device according to an embodiment.

Subsequently, the first adhesive tape 50 is cut such that the third outer diameter $OD_3$ is smaller than the first outer diameter $OD_1$ and larger than the second outer diameter $OD_2$ (FIG. 8). Subsequently, similarly to the first manufacturing method, the plating layer 94 is formed on the electrode 92. Thus, the semiconductor substrate 100 according to the embodiment is obtained. The semiconductor substrate 100 is diced, and the semiconductor device 200 according to the embodiment is obtained.

Next, a third manufacturing method for the semiconductor substrate 100 according to the embodiment will be described.

A third manufacturing method for the semiconductor device according to the embodiment, includes preparing a substrate having a substrate surface, the substrate having a first outer diameter, the substrate having a metal layer on the substrate surface, the metal layer having a second outer diameter smaller than the first outer diameter; attaching a first adhesive tape to the substrate and the metal layer through a first adhesive layer, the first adhesive tape having a first base material having a third outer diameter larger than the second outer diameter, the first base material having a first surface, a second surface opposed to the first surface, and a hole having a third inner diameter smaller than the second outer diameter, the first adhesive tape having the first adhesive layer provided on the first surface; and attaching a second adhesive tape on the second surface and the metal layer through a second adhesive layer, the second adhesive tape having a second base material, the second base material having a fourth outer diameter larger than the third inner diameter, the second base material having a third surface and a fourth surface opposed to the third surface, the second adhesive tape having the second adhesive layer provided on the third surface.

The point of preparing the substrate 2 having the ring projection 4 provided on the outer peripheral part of the first substrate surface 12, the ring projection 4 having the inner surface 8 and the top 6, the ring projection 4 having the inner diameter of the top being the fifth inner diameter $ID_5$ is similar to the first manufacturing method.

Figure 9:
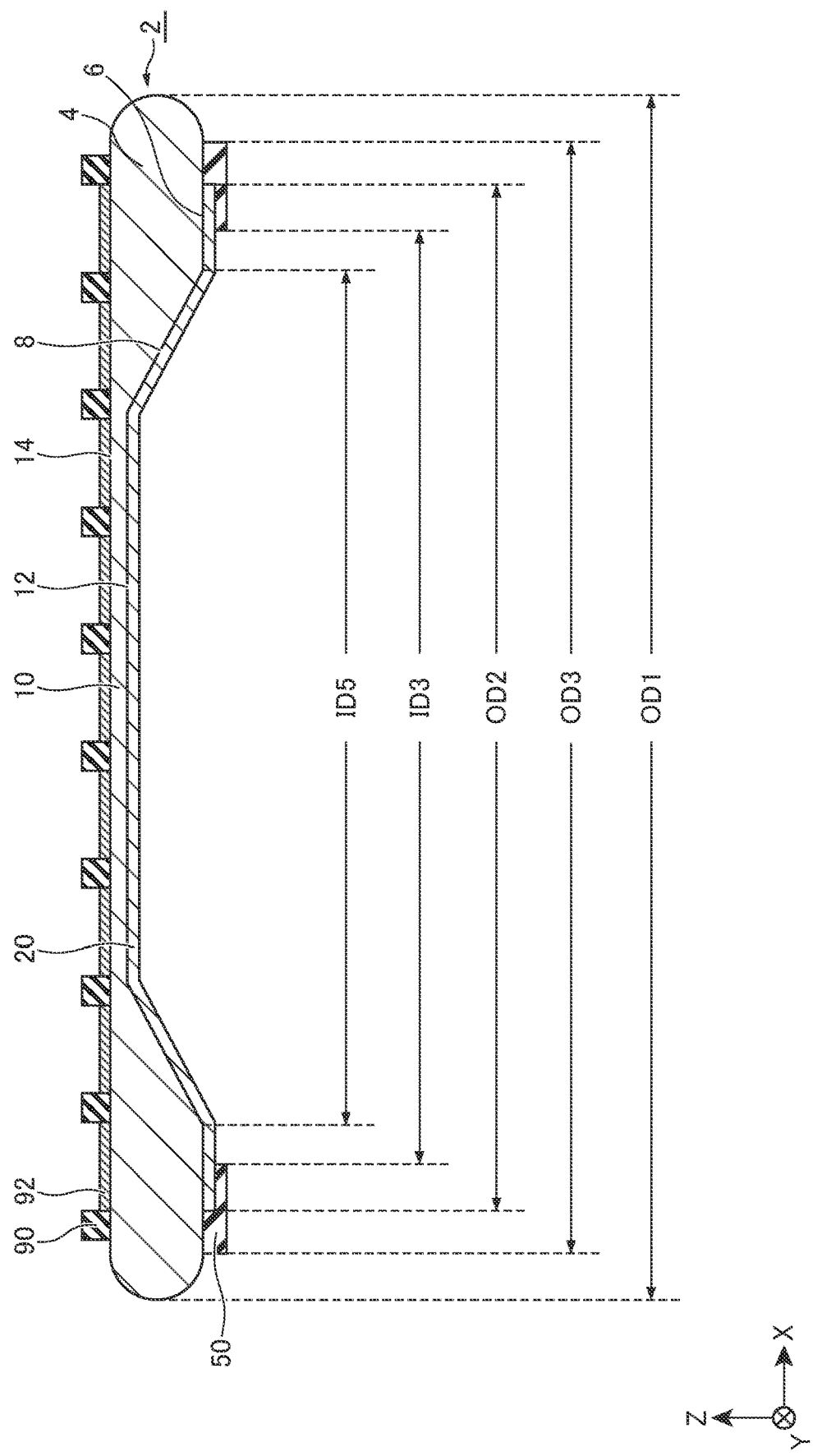
FIG. 9 is a schematic cross sectional view showing the manufacturing process steps of a third manufacturing method for the semiconductor device according to an embodiment.

Subsequently, the first surface 52 of the first adhesive tape 50 having a ring shape having the third outer diameter $OD_3$ smaller than the first outer diameter $OD_1$ and larger than the second outer diameter $OD_2$ and the third inner diameter $ID_3$ smaller than the second outer diameter $OD_2$ and lager than the fifth inner diameter $ID_3$ is attached to the top 6 and the metal layer 20 provided on the part of the top 6 through the first adhesive layer 62 (FIG. 9). In other words, the first surface 52 of the first adhesive tape 50 is in advance cut into a ring shape having the third outer diameter $OD_3$ and the third inner diameter $ID_3$, and then the first surface 52 is attached to the top 6 and the metal layer 20 provided on the part of the top 6.

Subsequently, the third surface 72 of the second adhesive tape 70 having the fourth outer diameter $OD_4$ smaller than the first outer diameter $OD_1$ and larger than the third inner diameter $ID_3$ is attached on the second surface 54 and the metal layer 20 through the second adhesive layer 82. In other words, in the third manufacturing method, similarly to the second manufacturing method, the second adhesive tape 70 is cut in advance to have the fourth outer diameter $OD_4$, and then the third surface 72 of the second adhesive tape 70 is attached on the second surface 54 and the metal layer 20 through the second adhesive layer 82 (FIG. 10). Subsequently, similarly to the first manufacturing method and the second manufacturing method, the plating layer 94 is formed on the electrode 92. Thus, the semiconductor substrate 100 according to the embodiment is obtained. The semiconductor substrate 100 is diced, and the semiconductor device 200 according to the embodiment is obtained.

It should be noted that any of the first manufacturing method to the third manufacturing method can be preferably used for manufacturing the semiconductor device 200 according to the embodiment.

Next, the operation and effect on the semiconductor device 200 with the configuration of the present embodiment are described.

In forming the plating layer 94 on the electrode 92, the metal layer 20 is preferably protected such that the plating solution does not contact, the metal layer 20. When the plating solution contacts the metal layer 20, a part or all of the metal layer 20 is dissipated. This easily leads to a mounting failure on a die pad with a faulty electrode 92.

In order to protect the metal layer 20, it can be considered that one piece of adhesive tape having an outer diameter larger than the second outer diameter $OD_2$ is attached so as to entirely cover the surface of the metal layer 20. However, a problem arises in that a plating solution penetrates from the gap between the substrate 2 and the adhesive tape to cause the plating solution to contact the metal layer 20.

Therefore, in the method of manufacturing the semiconductor substrate according to the embodiment, the first adhesive tape 50 and the second adhesive tape 70 are used. The first adhesive tape 50 has the first base material 56. The first adhesive tape 50 or the first base material 56 has a ring shape having the third outer diameter $OD_3$ smaller than the first outer diameter $OD_1$ and larger than the second outer diameter $OD_2$ and the third inner diameter $ID_3$ smaller than the second outer diameter $OD_2$, the first base material 56 having the first surface 52 and the second surface 54 opposed to the first surface 52. The first adhesive tape 50 has the first adhesive layer 62 provided on the first surface 52. The first adhesive tape 50 is attached to the first substrate surface 12 and the metal layer 20 through the first adhesive layer 62. The second adhesive tape 70 has the second base material 76. The second adhesive tape 70 or the second base material 76 has the fourth outer diameter $OD_4$ smaller than the first outer diameter $OD_1$ and larger than the third inner diameter $ID_3$, the second base material 76 having the third surface 72 and the fourth surface 74 opposed to the third surface 72. The second adhesive tape 70 has the second adhesive layer 82 provided on the third surface 72. The second adhesive tape 70 connected to the second surface 54 and the metal layer 20 through the second adhesive layer 82.

With the provision of the first adhesive tape 50, the end of the metal layer 20 is covered with the first adhesive tape 50, and thus the plating solution is less likely to contact the metal layer 20.

In the case in which the first adhesive tape 50 is attached on the first substrate surface 12 and the second substrate surface 14, unnecessary tension is likely to be applied to the first adhesive tape 50. However, the third outer diameter $OD_3$ of the first adhesive tape 50 is smaller than the first outer diameter $OD_1$. Therefore, the first adhesive tape 50 is not attached on the first substrate surface 12 and the second substrate surface 14. Thus, unnecessary tension is not likely to be applied to the first adhesive tape 50. Accordingly, a semiconductor device of high reliability can be provided.

Preferably, the first adhesive tape 50 further has the third adhesive layer 64 provided on the second surface 54, and the second adhesive layer 82 is attached to the second surface 54 through the third adhesive layer 64. This is because the attachment of the third adhesive layer 64 to the second adhesive layer 82 further makes the plating solution difficult to penetrate into the metal layer 20.

The fourth outer diameter $OD_4$ of the second adhesive tape 70 is preferably equal to the third outer diameter $OD_3$ of the first adhesive tape 50 or less. In the case in which the fourth outer diameter $OD_4$ is larger than the third outer diameter $OD_3$, the second adhesive tape 70 is attached on the inner side and outer side of the ring shape of the first adhesive tape 50. In this case, much larger tension is applied to the second adhesive tape 70, resulting in easy penetration of the plating solution into the metal layer 20.

The semiconductor substrate 100 according to the embodiment is more suited to being applied to the case that the substrate 2 has the ring projection 4 provided along the outer periphery of the first substrate surface 12, the ring projection 4 has the inner surface 8 and the top surface 6, the inner diameter of the top 6 is the fifth inner diameter $ID_5$, and the metal layer 20 is further provided on the inner surface 8 and the part of the top 6. In the case in which the ring projection 4 is provided, the second adhesive tape 70 is attached on the top 6, the inner surface 8, and the first substrate surface 12. In this case, the tension of the second adhesive tape 70 is not uniform between the top 6 and the inner surface 8 and between the inner surface 8 and the first substrate surface 12. This causes the second adhesive tape 70 to be likely to lose sealability, which the second adhesive tape 70 originally has, resulting in easy penetration of the plating solution into the metal layer 20.

In this case, the third inner diameter $ID_3$ is preferably larger than the fifth inner diameter $ID_5$. In other words, the first adhesive tape 50 is preferably attached so as not to be applied to the inner surface 8. This is because the application of the first adhesive tape 50 to the inner surface 8 applies much larger tension, and sealability, which the first adhesive tape 50 originally has, is likely to be lost, resulting in easy penetration of the plating solution into the metal layer 20.

In this case, the first, adhesive layer 62 is preferably attached on the part of the top 6 and the metal layer 20 provided on the top 6. This is because the metal layer 20 provided on the part of the top 6 is more reliably protected from the plating solution.

According to the semiconductor device of the embodiment, a highly reliable semiconductor substrate and a method of manufacturing a semiconductor device can be provided.

While certain embodiments have been described, these embodiments have been presented by way of example only, and are not intended to limit the scope of the inventions. Indeed, methods of manufacturing semiconductor substrates and devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor substrate comprising:
a substrate having a first substrate surface, the substrate having a first outer diameter;
a metal layer provided on the first substrate surface, the metal layer having a second outer diameter smaller than the first outer diameter;
a first adhesive tape having a ring shape, the ring shape having a third outer diameter smaller than the first outer diameter and larger than the second outer diameter, the ring shape having a third inner diameter smaller than the second outer diameter, the first adhesive tape having a first base material, the first base material having a first surface and a second surface opposed to the first surface, the first adhesive tape having a first adhesive layer provided on the first surface, the first adhesive tape being attached to the first substrate surface and the metal layer through the first adhesive layer; and
a second adhesive tape having a fourth outer diameter smaller than the first outer diameter and larger than the third inner diameter, the second adhesive tape having a second base material having a third surface and a fourth surface opposed to the third surface, the second adhesive tape having a second adhesive layer provided on the third surface, the second adhesive tape being attached to the second surface and the metal layer through the second adhesive layer.

2. The semiconductor substrate according to claim 1, wherein
the first adhesive tape further has a third adhesive layer provided on the second surface, and
the third surface is attached to the second surface through the third adhesive layer.

3. The semiconductor substrate according to claim 1, wherein
the substrate further has a ring projection provided along an outer periphery of the first substrate surface/ the ring projection having a top and an inner surface connecting the top to the first substrate surface, the ring projection having an inner diameter of the top being a fifth inner diameter,
the third inner diameter is larger than the fifth inner diameter,
the metal layer is further provided on a part of the top and the inner surface, and
the first adhesive layer is in contact with the metal layer provided on a part of the top and the top.

4. The semiconductor substrate according to claim 1, wherein
the substrate further has a second substrate surface opposed to the first substrate surface, and
the substrate further has a transistor provided on the second substrate surface.

5. The semiconductor substrate according to claim 4, wherein
the metal layer is an electrode of the transistor.

6. The semiconductor substrate according to claim 1, wherein
the fourth outer diameter is equal to the third outer diameter or less.

* * * * *